(12) United States Patent
Li et al.

(10) Patent No.: US 7,903,419 B2
(45) Date of Patent: Mar. 8, 2011

(54) HEAT DISSIPATION DEVICE HAVING A BACK PLATE UNIT

(75) Inventors: Hao Li, Shenzhen (CN); Jun Long, Shenzhen (CN); Tao Li, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 847 days.

(21) Appl. No.: 11/845,735

(22) Filed: Aug. 27, 2007

(65) Prior Publication Data
US 2009/0056918 A1    Mar. 5, 2009

(51) Int. Cl.
*H05K 7/20* (2006.01)
*H01L 23/34* (2006.01)
*F28F 7/00* (2006.01)

(52) U.S. Cl. ......... 361/719; 361/697; 361/709; 257/718; 257/719; 257/722; 165/80.2; 165/80.3; 165/185; 174/16.3; 174/252; 24/458; 24/459; 24/520

(58) Field of Classification Search .................. 361/697, 361/709, 710, 719; 257/718–719, 722; 165/80.2–80.3, 185; 174/16.3, 252; 24/458, 24/459, 520
See application file for complete search history.

(56) References Cited

U.S. PATENT DOCUMENTS

| | | | | |
|---|---|---|---|---|
| 6,229,706 | B1 * | 5/2001 | Cook et al. | 361/719 |
| 6,549,412 | B1 * | 4/2003 | Ma | 361/704 |
| 6,885,557 | B2 * | 4/2005 | Unrein | 361/704 |
| 7,042,727 | B2 * | 5/2006 | Ulen et al. | 361/704 |
| 7,142,430 | B2 | 11/2006 | Lee et al. | |
| 7,352,586 | B2 * | 4/2008 | Kuang et al. | 361/719 |
| 7,539,027 | B2 * | 5/2009 | Callahan et al. | 361/803 |
| 7,546,943 | B2 * | 6/2009 | Barina et al. | 228/44.7 |
| 2006/0002089 | A1 * | 1/2006 | Tran et al. | 361/709 |

FOREIGN PATENT DOCUMENTS

| | | |
|---|---|---|
| CN | 2664185 Y | 12/2004 |
| TW | M249436 | 11/2004 |

* cited by examiner

*Primary Examiner* — Zachary M Pape
(74) *Attorney, Agent, or Firm* — Jeffrey T. Knapp

(57) ABSTRACT

A heat dissipation device for dissipating heat from an electronic component (12) mounted on a printed circuit board (10) includes a retention module (30) resting on the printed circuit board, a heat sink (20) disposed on the retention module for contacting the electronic component, a clip (40) for securing the heat sink to the retention module, and a back plate unit mounted below the printed circuit board for engaging with the retention module and supporting the electronic component. The back plate unit includes a back plate (50), a gasket (62) engaging with the back plate, and a bracket (64) being sandwiched between the gasket and the back plate. The gasket has an annular top face contacting the printed circuit board, and a plurality of blocks (6202) contacting the back plate, whereby the gasket can provide a sufficient and uniform support to the electronic component.

20 Claims, 4 Drawing Sheets

HEAT DISSIPATION DEVICE HAVING A BACK PLATE UNIT

BACKGROUND OF THE INVENTION

1. Field of the Invention

The present invention relates to a heat dissipation device, and more particularly to a heat dissipation device having a back plate unit for connecting with a retention module and reinforcing support to an electronic component with which a heat sink of the heat dissipation device engages.

2. Description of Related Art

A heat sink is usually placed in thermal contact with an electronic component such as a central processing unit (CPU), and transfers heat through conduction from the electronic component so as to prevent over-heating of the electronic component. Usually, a heat sink is secured to an electronic component by using a locking device.

U.S. Pat. No. 7,142,430 discloses a heat dissipation device. The heat dissipation device comprises a heat sink and a locking device for securing the heat sink on an electronic component that is mounted on a printed circuit board. The locking device comprises a retention module resting on the printed circuit board, a clip attached to the retention module, and a back plate unit mounted below the printed circuit board. The back plate unit comprises a back plate and a gasket attached on the back plate, wherein the back plate has two opposite latches formed at two lateral sides thereof, and the gasket has a pair of elastic wings connecting each other and a pair of tabs formed at junctions of the wings. Two blocks are attached on the pair of wings of the gasket respectively. In use, the back plate is mounted beneath the printed circuit board by the retention module in such a manner that the pair of tabs of the gasket engage with the latches of the back plate with the blocks pressing upwardly against the printed circuit board, thereby providing a support to the electronic component.

However, pressure exerted by the gasket only acts on the two blocks, which cannot give the electronic component a sufficient and uniform support, whereby the electronic component may be damaged or deform due to the downward pressing force of the heat sink on the electronic component.

What is needed, therefore, is an improved heat dissipation device which can overcome the above problems.

SUMMARY OF THE INVENTION

A heat dissipation device is disclosed for dissipating heat from an electronic component mounted on a printed circuit board. The heat dissipation device includes a retention module resting on the printed circuit board, a heat sink disposed on the retention module for contacting the electronic component, a clip securing the heat sink to the retention module, and a back plate unit mounted below the printed circuit board for engaging with the retention module and reinforcing support to the electronic component. The back plate unit includes a back plate, a gasket engaging with the back plate, and a bracket sandwiched between the gasket and the back plate. The gasket has an annular top face contacting the printed circuit board, and a plurality of blocks extending downwardly for contacting the back plate. An annular engaging region is formed between the gasket and the printed circuit board, whereby the electronic component can obtain a better support from the back plate unit to prevent the electronic component from damage or deformation due to the downward pressing force from the heat sink.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
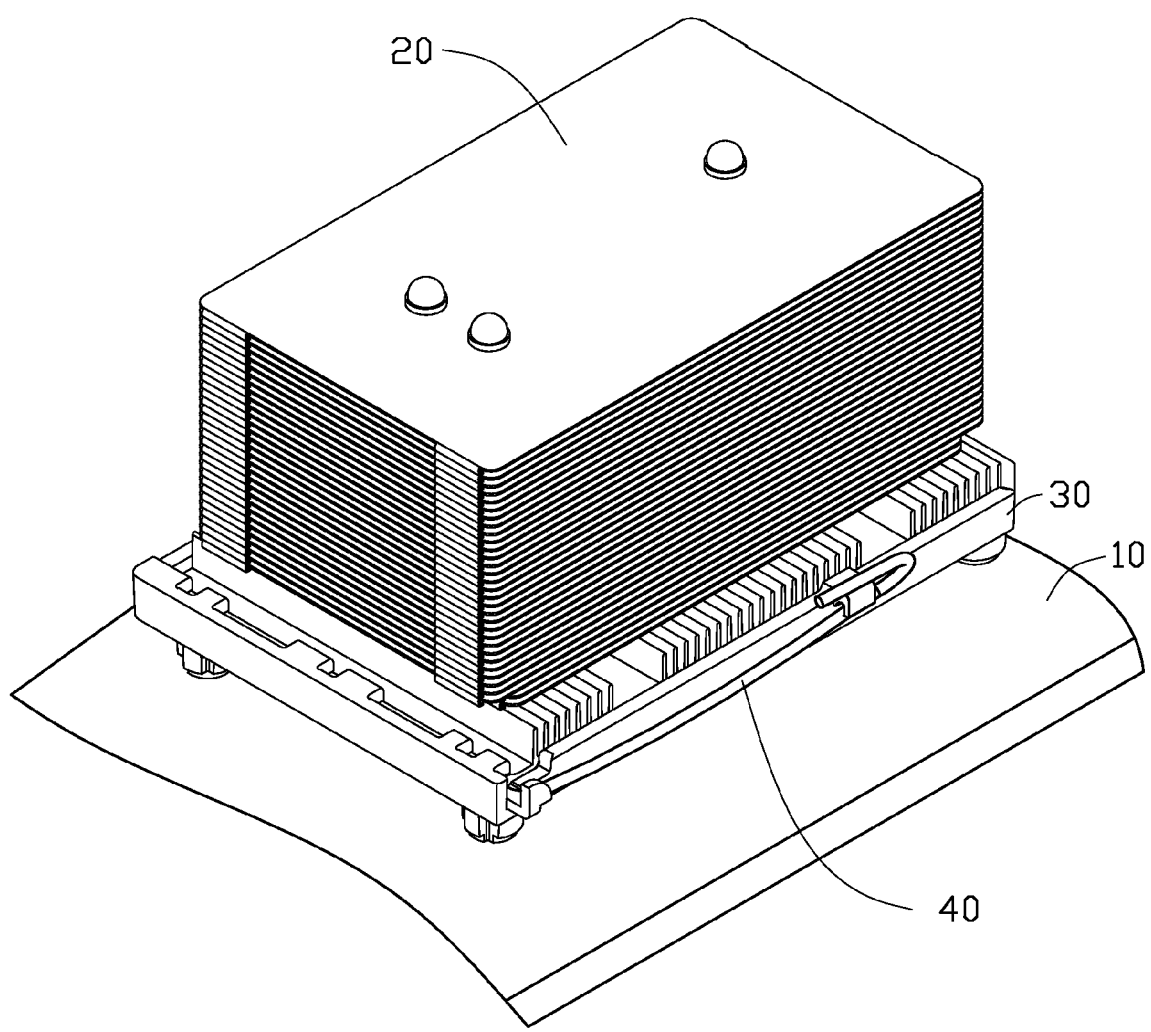
FIG. 1 is an assembled, isometric view of a heat dissipation device in accordance with a preferred embodiment of the present invention, with a printed circuit board having an electronic component mounted thereon.
Figure 2:
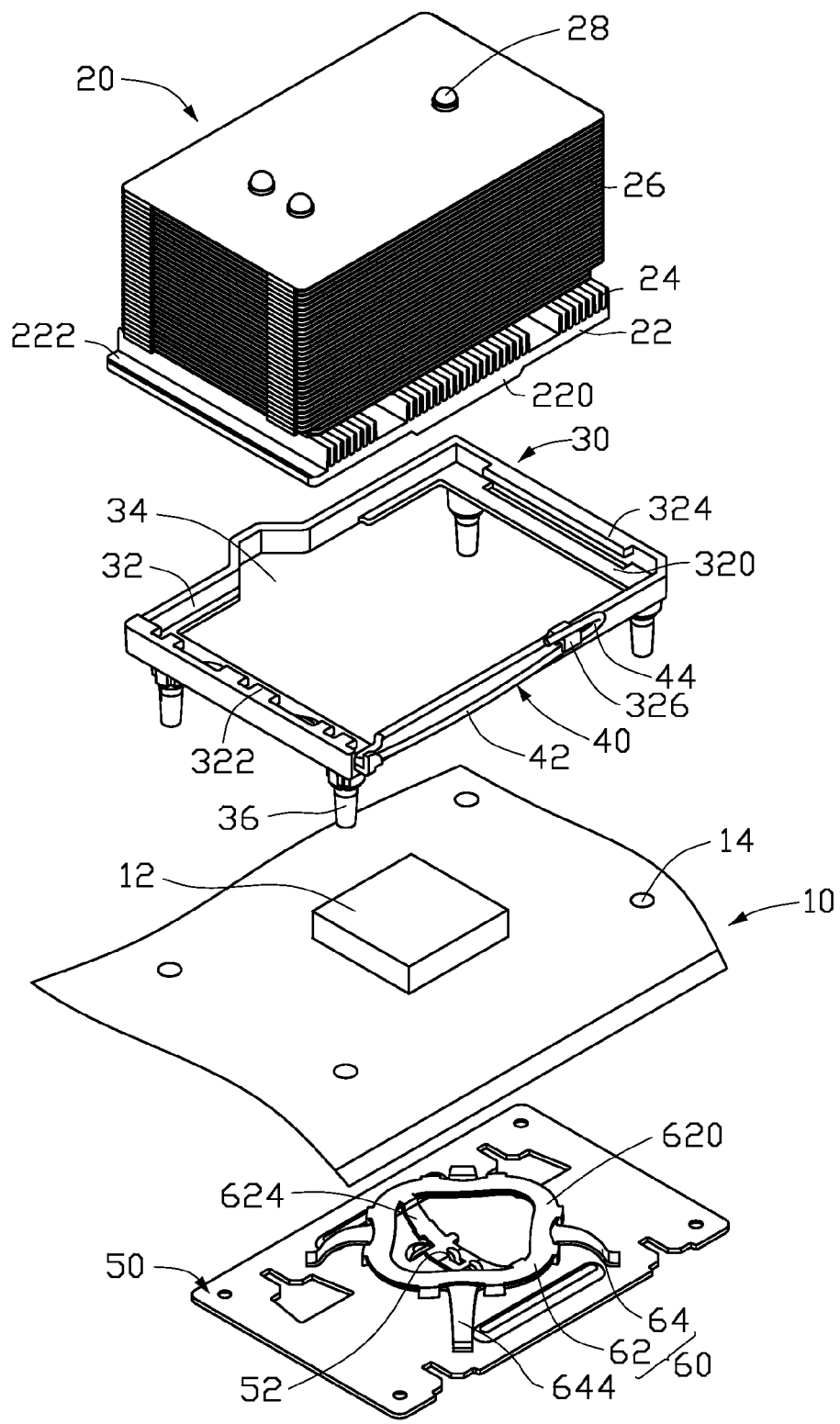
FIG. 2 is an exploded view of FIG. 1.

Referring to FIGS. 1-2, a heat dissipation device of a preferred embodiment of the present invention is used for dissipating heat from an electronic component 12 mounted on a printed circuit board 10. The printed circuit board 10 has four through holes 14 defined near four corners of the electronic component 12. The heat dissipation device comprises a heat sink 20 and a locking device (not labeled).

The heat sink 20 comprises a base 22 that has a projection 220 projecting downwardly from a bottom face of the base 22 for contacting the electronic component 12, and a plurality of first fins 24 extending upwardly from a top face of the base 22. The first fins 24 are spaced a distance from a lateral side of the base 22, whereby a pad 222 is formed beyond the first fins 24 at the lateral side of the base 22. A member (not shown) projects horizontally and outwardly from an opposite lateral side of the base 22 opposing to the pad 222. A plurality of parallel second fins 26 is stacked on the first fins 24 by soldering. The second fins 26 are oriented perpendicular to the first fins 24. A plurality of heat pipes 28 extends through the second fins 26, the first fins 24, and the base 22 for enhancing a heat dissipating efficiency of the heat sink 20.

The locking device comprises a retention module 30 mounted on the printed circuit board 10, a wire clip 40 attached to the retention module 30, a back plate 50 secured below the printed circuit board 10, and a gasket unit 60 sandwiched between the back plate 50 and the printed circuit board 10. The retention module 30 comprises four walls 32 connecting with each other to construct a rectangular configuration therefor. Two opposite walls 32 of the retention module 30 form a pair of abutting strips 320 extending inwardly from bottom portions of inner faces thereof, respectively, into an opening 34 enclosed by the four walls 32. A plurality of bulges 322 is formed inwardly from the inner face of one of the two opposite walls 32; a flange 324 extends inwardly from the inner face of the other one of the two opposite walls 32; the bulges 322 and the flange 324 are located above the abutting strips 320, so that a space is defined between the flange 324 and a corresponding abutting strip 320 for receiving the member of the heat sink 20 therein. A block 326 is formed outwardly from one of the other two opposite walls 32 with a slot (not labeled) defined in a bottom thereof. Four locking feet 36 extend downwardly and perpendicularly from four corners of the retention module 30.

The clip 40 is made by bending a wire spring and comprises a pressing section (not labeled) sandwiched between the bulges 322 and the abutting strip 320 below the bulges 322, and a locking section 42 extending perpendicularly from an end of the pressing section. A handle 44 is bent from a free end of the locking section 42 and engages with the block 326 of the retention module 30 when the clip 40 is at a locked position. The handle 44 is provided for facilitating an operator to operate the clip 40.

Figure 3:
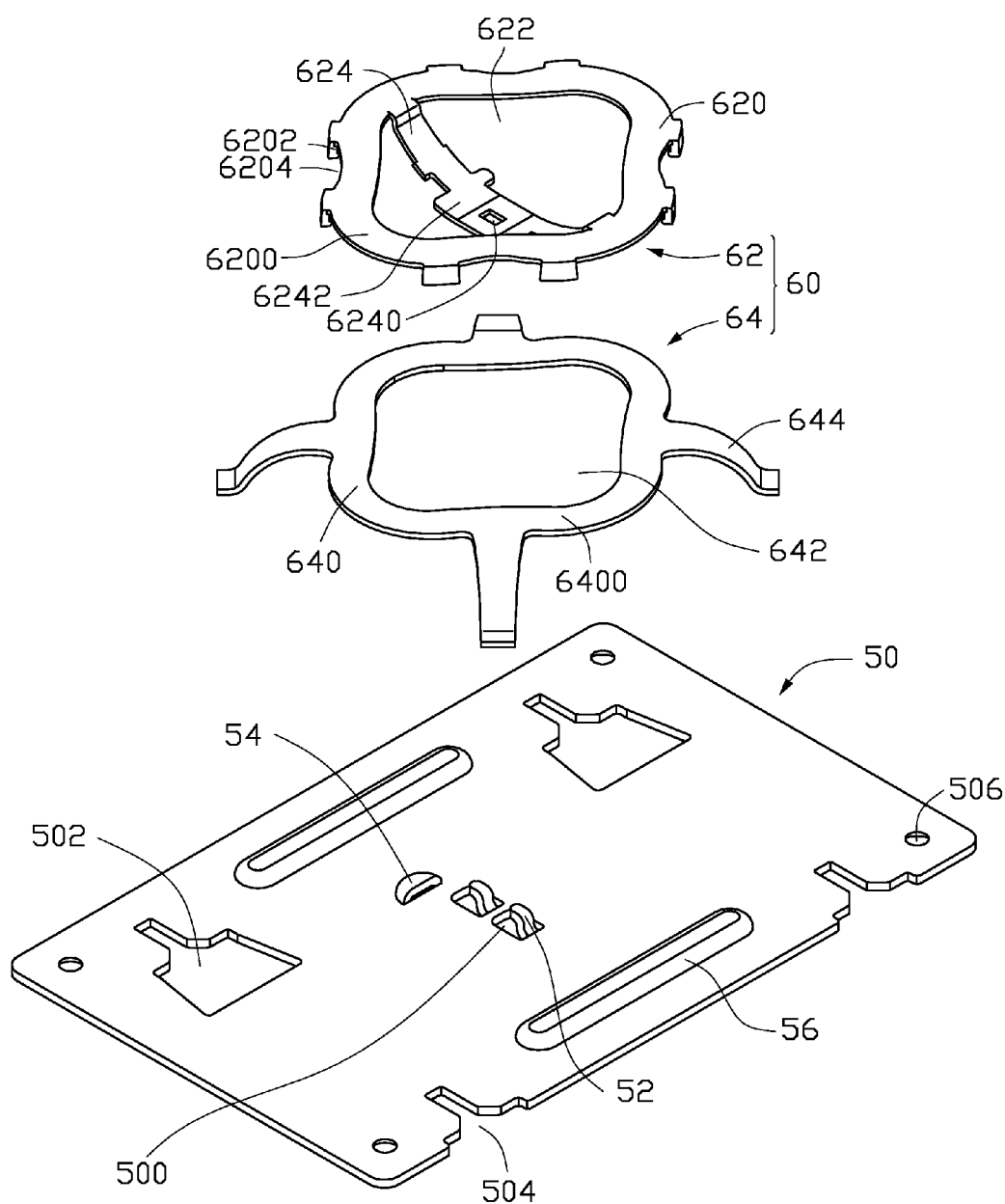
FIG. 3 is an enlarged view of a back plate unit of FIG. 1.

As shown in FIG. 3, the back plate 50 is for being mounted beneath the printed circuit board 10 and has a rectangular configuration. A pair of rectangular apertures 500 are defined in a central area and extend parallel to a short edge of the back plate 50. The back plate 50 has a pair of latches 52 extending upwardly from rims of the apertures 500 respectively with the pair of latches 52 oriented parallel to the short edge of the back plate 50. An arced protrusion 54 with a hole (not labeled) defined therein projects upwardly from a top face of the back plate 50 and adjacent to the apertures 500, wherein the protrusion 54 has an annular plane perpendicular to the top face of the back plate 50. The back plate 50 defines a pair of identical openings 502 at two lateral sides thereof, which are spaced from the apertures 500 with a same distance. A pair of identical cutouts 504 are defined in one of long edges of the back plate 50 and aligned with the openings 502, respectively. Two ribs 56 are formed upwardly from the top face of the back plate 50, where one rib 56 is located between the openings 502 and the other rib 56 is located between the cutouts 504. The latches 52 are located between the ribs 56. Four through holes 506 are defined in four corners of the back plate 50 and surround the apertures 500 for providing passages of screws (not shown) through the back plate 50.

The gasket unit 60 is attached on the back plate 50, and comprises a gasket 62 buckled to the back plate 50 and a bracket 64 located between the gasket 62 and the back plate 50. The gasket 62 is made as a single piece from a kind of elastic plastic and has four beams 620 connecting to each other to form a generally hollow and rectangular shape with an opening 622 being enclosed by the beams 620 and located in a centre of the gasket 62. Two adjacent beams 620 are connected together by an arc-shaped strip 6200. A pair of blocks 6202 projects downwardly and vertically from an outer side of each of the beams 620. An arced cutout 6204 is defined in an outer side of each beam 620 between the pair of blocks 6202 for enhancing resilience of the gasket 62. Bottom faces of the blocks 6202 are located in a common plane parallel to the back plate 50 to ensure that each block 6202 can contact the top face of the back plate 50 intimately. An engaging portion 624 extends downwardly through the opening 622 of the gasket 62, wherein the engaging portion 624 has two ends coupling with two diagonally opposite strips 6200 and a central area for contacting the top face of the back plate 50. A height of the engaging portion 624 above the back plate 50 is gradually decreased from the two ends toward the central area of the engaging portion 624; thus, the engaging portion 624 forms a curved configuration. The engaging portion 624 defines a pair of rectangular notches 6240 in the central area thereof, which extend along a lengthwise direction of the engaging portion 624. A border portion 6242 extends outwardly from a lateral side of the central area of the engaging portion 624.

The bracket 64 is made from a piece of metal for being compressed between the gasket 62 and the back plate 50. The bracket 64 comprises a generally rectangular and hollow body 640 which has a shape and size similar to those of a body of the gasket 62, wherein the body of the gasket 62 consists of the beams 620 and the strips 6200. The body 640 has four beams 6400 connecting with each other, and four legs 644 extending downwardly and outwardly from the four beams 6400 of the body 640 respectively. The four beams 6400 cooperate to enclose an opening 642 in a center of the bracket 64, which is identical to the opening 622 of the gasket 62 for allowing the engaging portion 624 of the gasket 62 to extend therethrough. Each of the legs 644 comprises a curved section (not labeled) slantwise connecting to a central portion of a corresponding beam 6400 of the bracket 64, and a planar section (not labeled) formed horizontally and outwardly from a bottom end of the curved section, wherein the four planar sections are coplanar with each other and parallel to the top face of the back plate 50 for disposing the bracket 64 on the back plate 50 stably. The four legs 644 are distributed evenly on an outer periphery of the body 640 of the bracket 64, with each of the legs 644 having a width gradually decreased along a top-to-bottom direction, wherein the width of each leg 644 is smaller than a width of a corresponding cutout 6204 of the gasket 62.

Also referring to FIG. 2, in preassembly of the back plate 50 and the gasket unit 60, the bracket 64 rests on the back plate 50 with the four legs 644 of the bracket 64 contacting the top face of the back plate 50, and the opening 642 of the bracket 64 located at a position where the latches 52 of the back plate 50 are positioned below a central area of the opening 642 of the bracket 64. Then the gasket 62 is disposed on the bracket 64 to sandwich the bracket 64 between the gasket 62 and the back plate 50 in such a manner that the engaging portion 624 of the gasket 62 projects downwardly though the opening 642 of the bracket 64 and contacts the top face of the back plate 50; the latches 52 of the back plate 50 are locked into corresponding notches 6240 of the gasket 62, and the protrusion 54 of the back plate 50 abuts against the border portion 6242 of the gasket 62, thus preventing the gasket 62 from sliding relative to the back plate 50. The beams and 620 and the strips 6200 of the gasket 62 substantially contact the beams 6400 of the bracket 64 for allowing the blocks 6202 of the gasket 62 located above the back plate 50, and the legs 644 of the bracket 64 extending through corresponding cutouts 6204 between adjacent blocks 6202 of the gasket 62, thereby constructing a combination of the back plate 50 and the gasket unit 60.

Figure 4:
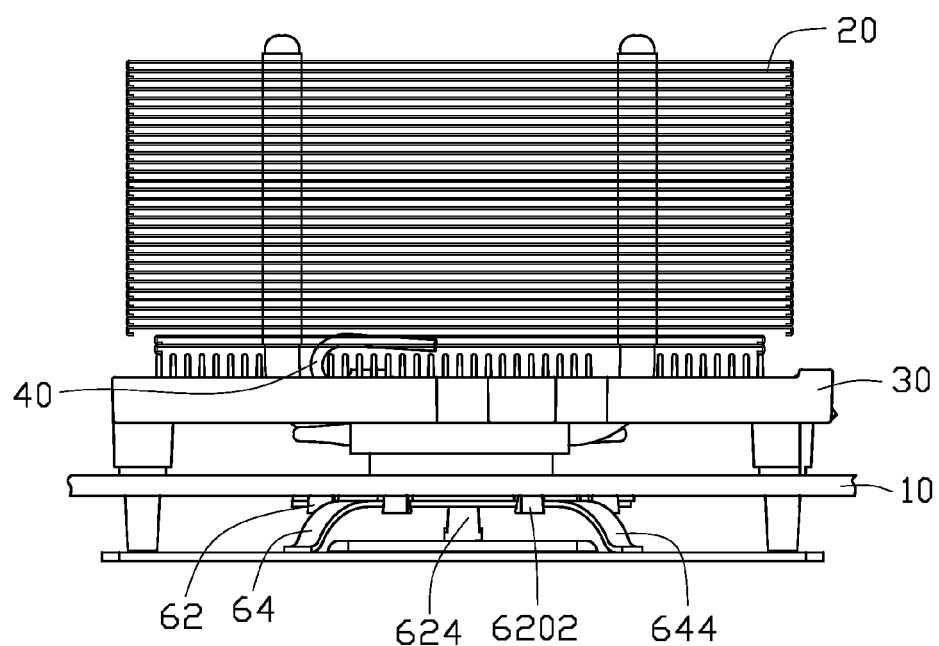
FIG. 4 is a side view of FIG. 1.

In assembly, the pressing section of the clip 40 is pivotably attached to the bulges 322 of the retention module 30, and the locking section 42 of the clip 40 is rotated to a corresponding position to hold the pressing section of the clip 40 away from a corresponding abutting strip 320 of the retention module 30. At this unlocked position, the handle 44 is disengaged from the block 326 and the locking section 42 of the wire clip 40 is moved to a position generally vertically above the retention module 30. The locking feet 36 of the retention module 30 extend through the holes 14 of the printed circuit board 10 with the opening 34 of the retention module 30 surrounding the electronic component 12. The combination of the back plate 50 and the gasket unit 60 is mounted below the printed circuit board 10 by four screws (not shown) which extend through the holes 506 of the back plate 50 and threadedly engage with the locking feet 36 of the retention module 30, wherein the beams 620 and the strips 6200 of the gasket 62 contact a bottom face of the printed circuit board 10 to form an annular contacting area between the gasket 62 and the printed circuit board 10. The beams 620 and the strips 6200 of the gasket 62 press upwardly against the printed circuit board 10. The heat sink 20 rests on the retention module 30 with the projection 220 contacting the electronic component 12, the pad 222 and the member abutting against the abutting strips 320 of the retention module 30. The handle 44 of the clip 40 is pivoted from the vertical orientation downwardly to engage with the block 326, whereby the pressing section of the clip 40 presses the pad 222 of the heat sink 20 downwardly; thus, the heat sink 20 can have an intimate contact with the electronic component 12. As also shown in FIG. 4, when the handle 44 of the clip 40 is retained in the slot of the block 326 of the retention module 30, the bracket 64 is pressed downwardly for allowing the blocks 6202 of the gasket 62 to abut downwardly against the back plate 50. Due to the pairs of blocks 6202 of the gasket 62 being distributed evenly on the beams 620 of the gasket 62, pressures exerted by the blocks 6202 of the gasket 62 are evenly distributed on the back plate 50, thereby preventing the back plate 50 from being unduly deformed. Furthermore, since the gasket unit 60 is located just below the electronic component 12 and the gasket 60 has an annular contacting area with the printed circuit board 10, the electronic component 12 can have a sufficient and uniform support against the heat sink 20 when the heat sink 20 is pressed downwardly to engage with the electronic component 12, thereby to prevent the electronic component 12 from damage or deformation due to the downward pressing force from the heat sink 20. Furthermore, such a sufficient and uniform support can ensure the intimate contact between the heat sink 20 and the electronic component 12.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat generated by an electronic component mounted on a printed circuit board, the heat dissipation device comprising:
   a heat sink adapted for contacting the electronic component;
   a retention module adapted for securing the heat sink on the printed circuit board;
   a back plate engaging with the retention module and adapted for being attached below the printed circuit board;
   a gasket unit adapted for being sandwiched between the printed circuit board and the back plate, comprising:
   a resilient bracket disposed on the back plate for abutting against the back plate resiliently; and
   an elastic gasket attached on the back plate, the gasket having a portion extending through the bracket and abutting against the back plate, and an annular top face adapted for contacting the printed circuit board, and exerting an even pressure on the printed circuit board.

2. The heat dissipation device as claimed in claim 1, wherein the gasket comprises a plurality of beams connecting with each other, and a curved engaging portion interconnecting two opposite ones of the beams.

3. The heat dissipation device as claimed in claim 2, wherein the beams of the gasket are coplanar with each other and adapted for contacting the printed circuit board to form an annular area contacting with the printed circuit board.

4. The heat dissipation device as claimed in claim 2, wherein each of the beams of the gasket has a pair of spaced blocks projecting downwardly from an outer side thereof, the pairs of blocks of the gasket being equidistantly spaced from each other and adapted for contacting the back plate for defining a plurality of evenly spaced areas contacting with the back plate.

5. The heat dissipation device as claimed in claim 4, wherein the beams of the gasket cooperatively enclose an opening with the engaging portion of the gasket projecting downwardly therethrough.

6. The heat dissipation device as claimed in claim 5, wherein the engaging portion of the gasket has two ends connecting to two opposite junctions of corresponding adjacent beams of the gasket, and a central area for abutting against the back plate, a height of the engaging portion above the back plate being gradually decreased from the two ends toward the central area of the engaging potion of the gasket.

7. The heat dissipation device as claimed in claim 5, wherein the engaging portion of the gasket has a pair of notches defined in the central area thereof, and a border portion extending outwardly from a lateral side of the central area, the central area and the border portion engaging with the back plate.

8. The heat dissipation device as claimed in claim 7, wherein the bracket comprises a ring-shaped body contacting the beams of the gasket, and a plurality of legs extending downwardly from the body of the bracket.

9. The heat dissipation device as claimed in claim 8, wherein the body of the bracket encloses an additional opening corresponding to the opening of the gasket for allowing the engaging portion of the gasket to extend downwardly therethrough.

10. The heat dissipation device as claimed in claim 8, wherein the legs of the bracket are spaced from each other and each of the legs is located between two adjacent blocks of the gasket to abut against the back plate resiliently.

11. The heat dissipation device as claimed in claim 8, wherein the back plate forms a pair of latches at a central area thereof, and a protrusion adjacent to the pair of latches, the pair of latches of the back plate being locked into corresponding notches of the engaging portion of the gasket, and the protrusion of the back plate abutting against the border portion of the gasket, to thereby prevent the gasket from sliding relative to the back plate.

12. A back plate unit adapted for engaging with a heat sink which is attached on a printed circuit board, the back plate unit comprising:
   a back plate adapted for being mounted below the printed circuit board;
   a resilient bracket comprising a ring-shaped body and a plurality of legs extending downwardly from the ring-shaped body to abut against the back plate;
   an elastic gasket comprising four beams connected with each other, and an engaging portion formed downwardly from two opposite joints of the beams to engage with the back plate, the beams of the gasket abutting against the body of the bracket and adapted for contacting the printed circuit board with an annular area.

13. The back plate unit as claimed in claim 12, wherein the four beams of the gasket cooperate to define an opening, and the body of the bracket defines an additional opening corresponding to the opening of the gasket for allowing the engaging portion of the gasket to extend therethrough.

14. The back plate unit as claimed in claim 12, wherein said each of the four beams of the gasket downwardly forms a pair of blocks at an outer side thereof, the blocks being provided for pressing the back plate.

15. The back plate unit as claimed in claim 14, wherein the legs of the bracket are equidistantly spaced from each other and each are located between corresponding adjacent two blocks of the gasket.

16. The back plate unit as claimed in claim 14, wherein a height of the engaging portion above the back plate is gradually decreased from two ends toward a central area of the engaging portion, the engaging portion defining a pair of notches in the central area thereof, and a border portion formed outwardly from an outer side of the central area, the notches of the gasket extending along a lengthwise direction of the engaging portion.

17. The back plate unit as claimed in claim 16, wherein the back plate forms a pair of latches at a central area thereof, and a protrusion adjacent to the pair of latches, the pair of latches of the back plate locked into corresponding notches of the engaging portion of the gasket, and the protrusion of the back plate abutting against the border portion of the gasket, thus preventing the gasket from sliding relative to the back plate.

18. An electronic assembly comprising:
a printed circuit board;
an electronic component mounted on the printed circuit board;
a retention module mounted on the printed circuit board and surrounding the electronic component, the retention module has a plurality of locking feet extending downwardly through the printed circuit board;
a heat sink having a base contacting with the electronic component;
a back plate located below a bottom surface of the printed circuit board and securely connected to the locking feet of the retention module; and
a gasket having a hollow body abutting upwardly against the bottom surface of the printed circuit board and an engaging portion extending through an opening of the gasket and having two ends connecting with the body and a central area downwardly extending to buckle with the back plate.

19. The electronic assembly as claimed in claim 18 further comprising a bracket mounted between the gasket and the back plate, wherein the bracket has an upper body abutting a bottom of the body of the gasket and a plurality of resilient legs extending downwardly to engage with the back plate.

20. The electronic assembly as claimed in claim 19, wherein the hollow body of the gasket has a ring-shaped configuration.

* * * * *